United States Patent
Lloyd et al.

(10) Patent No.: US 12,153,176 B2
(45) Date of Patent: Nov. 26, 2024

(54) FLEXIBLE GRADIENT-BASED RESERVOIR SIMULATION OPTIMIZATION

(71) Applicant: Schlumberger Technology Corporation, Sugar Land, TX (US)

(72) Inventors: Geraint Lloyd, Kidlington (GB); Kieran Neylon, Shepperton (GB)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 416 days.

(21) Appl. No.: 15/733,433

(22) PCT Filed: Feb. 4, 2019

(86) PCT No.: PCT/US2019/016464
§ 371 (c)(1),
(2) Date: Jul. 29, 2020

(87) PCT Pub. No.: WO2019/152907
PCT Pub. Date: Aug. 8, 2019

(65) Prior Publication Data
US 2021/0263175 A1   Aug. 26, 2021

Related U.S. Application Data

(60) Provisional application No. 62/625,648, filed on Feb. 2, 2018.

(51) Int. Cl.
*G01V 1/30* (2006.01)
*G01V 1/28* (2006.01)
(Continued)

(52) U.S. Cl.
CPC .............. *G01V 1/30* (2013.01); *G01V 1/28* (2013.01); *G01V 20/00* (2024.01); *G06F 30/20* (2020.01); *G01V 2210/66* (2013.01)

(58) Field of Classification Search
CPC ...... G01V 1/30; G01V 20/00; G01V 2210/66; G01V 1/28; G01V 99/005; G06F 30/20
(Continued)

(56) References Cited

U.S. PATENT DOCUMENTS 7,957,946 B2 * 6/2011 Pirovolou ................. E21B 7/04
703/10
2008/0294387 A1   11/2008 Anderson et al.
(Continued)

FOREIGN PATENT DOCUMENTS

WO   2017074885 A1   5/2017

OTHER PUBLICATIONS

Merriam-Webster Dictionary. Definition of Plug-in. Accessed Jun. 4, 2022. https://www.merriam-webster.com/dictionary/plug-in (Year: 2022).*
(Continued)

*Primary Examiner* — John E Johansen

(57) ABSTRACT

A method includes receiving seismic data related to a subterranean formation. The method also includes receiving a selection of a property of the subterranean formation that is permitted to vary during a simulation of a model of the subterranean formation. The method also includes simulating fluid flow in the model of the subterranean formation based at least partially on the seismic data, and the selected property. The method also includes generating an updated model based at least partially upon a result of simulating the fluid flow in the model.

14 Claims, 4 Drawing Sheets

(51) Int. Cl.
  *G01V 20/00* (2024.01)
  *G06F 30/20* (2020.01)
(58) Field of Classification Search
  USPC ............................................................. 703/10
  See application file for complete search history.

(56) References Cited

U.S. PATENT DOCUMENTS

| | | |
|---|---|---|
| 2013/0297273 A1 | 11/2013 | Altundas et al. |
| 2013/0338984 A1* | 12/2013 | Braaksma ............... G01V 1/345 703/10 |
| 2014/0278115 A1* | 9/2014 | Bas ....................... G01V 99/005 702/14 |
| 2016/0161635 A1 | 6/2016 | Ramsay et al. |
| 2016/0170087 A1 | 6/2016 | Yarus et al. |

OTHER PUBLICATIONS

International Preliminary Report on Patentability mailed Aug. 13, 2020 in International Application No. PCT/US2019/016464, 8 pages.
Sarma P. et al., "Implementation of Adjoint Solution for Optimal Control of Smart Wells," SPE 92864, 2005 SPE Reservoir Simulation Symposium held in Houston, Texas U.S.A. Jan. 31, 2005-Feb. 2, 2005, 17 pages.
Search Report and Written Opinion of International Patent Application No. PCT/US2019/016464 dated May 3, 2019 (11 pages).

* cited by examiner

FLEXIBLE GRADIENT-BASED RESERVOIR SIMULATION OPTIMIZATION

CROSS-REFERENCE TO RELATED APPLICATIONS

This application claims priority to U.S. Provisional Patent Application No. 62/625,648, filed on Feb. 2, 2018, the entirety of which is incorporated by reference herein.

BACKGROUND

Reservoir simulation models may be optimized by determining a maximum or minimum of a value of interest from a model as input parameters vary. More particularly, uncertain parameters in the reservoir simulation models may be adjusted to enable a better match between the simulation results and data which has already been observed in the field. Optimization may also allow parameters within a field management strategy to be adjusted to maximize a performance indicator from the planned field operation, such as total hydrocarbon production or net present value.

There are many approaches to optimization. Many optimizers work by making changes to the model parameters and measuring how the values of interest change. By exploring the 'space' of options afforded by changing parameters, and keeping note of past parameter values and results, the optimization may move to a peak (or trough) in the value that is being optimized. If the gradient of the value(s) of interest with respect to the parameters is known, and if the value has a substantially smooth variation as parameters change, then an optimizer can use this information to reach the peak more efficiently. These gradient-based optimization mechanisms are powerful but rely on the gradients being calculable. The adjoint method is one approach that can be used by a simulator to calculate such gradients and may be used to optimize values by adjusting a very large number (e.g., potentially millions) of different input parameters.

Optimization is a different task than simulation. There are traditionally two approaches to applying optimization methods to simulation results. The first is to include optimization methods as part of the in-built functionality of the simulator. The second is to use an external optimization package that drives the simulations. Both approaches have challenges. For example, using an external optimizer involves a high level of coupling between two separate software applications with an external optimizer having to keep pace with changes to the simulator, so that it can 'drive' the simulator with changing parameter values as the simulator is developed and modified, and so that it can understand and read the simulator outputs. There are also challenges when it comes to making use of the same infrastructure as the simulator, for example, if running parallel simulations, as is common for simulation of larger fields. Keeping the optimizer internal (i.e., a part of the simulator), however, involves a diverse range of skills within the same development team, prevents separation of the development of the optimizer and simulator on different timescales, and makes rapid development and prototyping of new optimization algorithms much more challenging.

SUMMARY

A method is disclosed. The method includes receiving seismic data related to a subterranean formation. The method also includes receiving a selection of a property of the subterranean formation that is permitted to vary during a simulation of a model of the subterranean formation. The method also includes simulating fluid flow in the model of the subterranean formation based at least partially on the seismic data, and the selected property. The method also includes generating an updated model based at least partially upon a result of simulating the fluid flow in the model.

A computing system is also disclosed. The computing system includes a simulator configured to receive seismic data related to a subterranean formation, receive a selection of a property of the subterranean formation, and run a simulation of a model of the subterranean formation based at least partially upon the seismic data and the selected property. The selected property is permitted to vary during the simulation. The selected property is related to rock, fluid, or both in the subterranean formation. Other properties of the subterranean formation that are not selected remain fixed during the simulation. A user has a higher confidence that the other properties that are not selected are accurate in comparison to the selected property. The computing system also includes a plugin configured to cause the simulator to run a subsequent simulation of the model using a different selected property, and cause the simulator to produce calculations of gradients of a value of interest for the simulation and the subsequent simulation.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
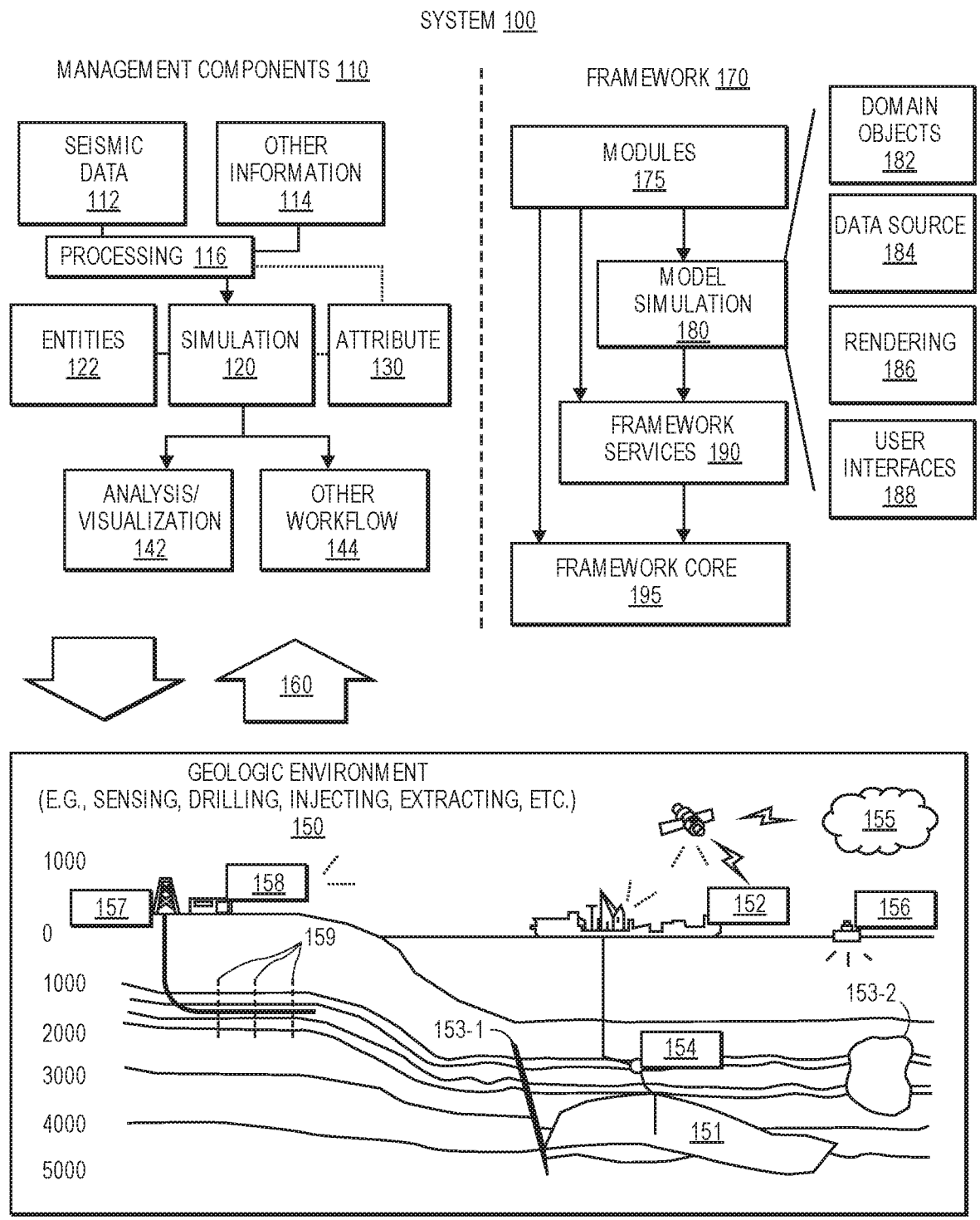
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Texas), the INTERSECT™ reservoir simulator (Schlumberger Limited, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

The system and method disclosed herein provide a flexible gradient-based optimizer for reservoir simulation without having to provide interfacing between the simulator and external optimization software. The system and method solve this problem by using a reservoir simulator extensibility mechanism. Specifically, the INTERSECT™ reservoir simulator extensibility mechanism may be used, which has been improved to enable the simulation to be run multiple times with different parameters to perform optimization. INTERSECT™ previously had the capability to calculate gradients using the adjoint method for some values of interest and input parameters.

The extensibility mechanism dynamically loads the optimization package as a 'plugin' (i.e., it is loaded soon after the applications starts). In this way, the optimizer and simulator may maintain their independence and be developed and extended separately. The dynamic loading of the optimization plugin by the simulator process enables a close coupling to provide performant communication between the simulator and the optimizer, and makes use of the simulation run time environment and run management, including the ability to be run in parallel.

The optimization algorithm can be provided using standard optimization libraries or independently developed implementations of standard algorithms that are incorporated into the plugin. These can be switched as new optimization libraries are developed. This new approach maintains a clean separation between the simulator and the optimizer, allowing development of both pieces of software to occur separately and independently. The approach also provides flexibility by introducing a lightweight optimization layer which can be updated. In addition, this approach uses the simulator extensibility mechanism to allow straightforward and seamless communication between the simulator and the optimizer (e.g., simulation results to the optimizer and changed parameters back to the simulator).

An extensibility mechanism provides advantages of both the separation of the simulation and optimization software, and also a close coupling. The optimization plugin is dynamically loaded, with no direct dependence of the simulator on the plugin, to enable the optimizer plugin to be built and released independently and without the knowledge of the simulator. This allows the optimizer to be installed and updated separately.

The optimization plugin may be built separately from the simulator. There may be no run-time dependence of the simulator on any libraries provided by the optimizer. The optimization plugin may be discoverable by the simulator at run time by using a discovery mechanism (e.g., a file-based discovery mechanism), which searches for the presence of any plugins that are available for loading (e.g., by reading one or more plugin description files with a standard extension within the simulator installation directory). The simulator input arguments specify which of the available plugins should be loaded. The simulator may call the plugin entry point to enable communication between the simulator and plugin to commence. The optimization plugin can be built either using an independent simulator plugin software development kit (SDK), which provides the headers (or function definitions) and libraries that the plugin can be built against. In another embodiment, the optimization plugin can be built against the full simulator source code and libraries if these are available. A plugin build may be specific to the released version of the simulator that it was built against. The simulator may be restartable (i.e., it is possible to restart the simulation from the beginning without impacting the results). The restarted simulation results may be the same as if it was just run once. Each simulation run started by the optimizer acts as a separate simulation; however, the software process does not end between simulations. The optimizer plugin is able to define additional input to the simulator, which it can then query from the simulator. This enables a single input format to specify the data for both the simulation and the optimization. Simulator-specific input (e.g., model options) remains the responsibility of the simulation software.

In addition to the independence provided by dynamic loading of the optimizer as a simulation plugin, there may be ease of communication between the simulator and the plugin to allow for effective coordination. The simulator may provide access to the gradient calculations and simulation results through headers and library function calls that are available to the plugin. The plugin may be loaded on the processes when the simulator is run in parallel so that it can make use of parallel algorithms and communication between each instance of the simulator and the plugin. This also enables the simulator to maintain use of the parallel infrastructure that has been set aside for the simulator throughout the full optimization and related set of simulation runs. This simplifies run management of the optimization.

In addition, there is no need to develop separate run management capabilities or a separate run-time environment/interface for the optimization. Instead, the optimizer is run, from the user's perspective, as part of the simulator, and uses the existing facilities that are already present for running the simulator. This is particularly useful if the simulation (and optimization) is run in parallel. As the optimization algorithm is deployed separately to the simulator, an optimization algorithm or library may be incorporated, which has greater restrictions on its use or redistribution than the simulator, without compromising the integrity of the simulator.

Figure 2:
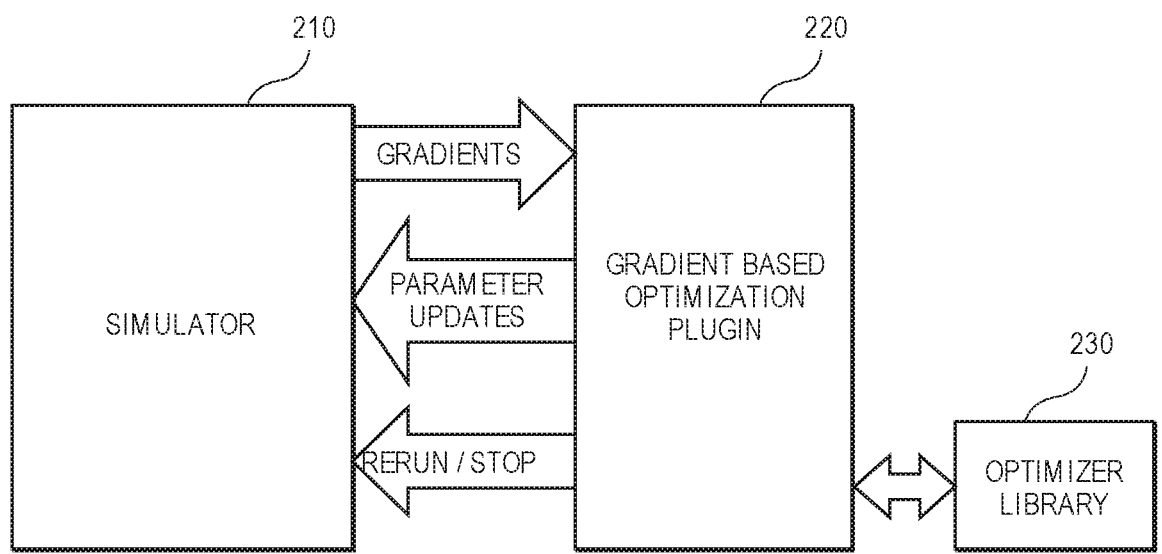
FIG. 2 illustrates a schematic view of an example of the architecture of the optimization and simulation, according to an embodiment.

FIG. 2 illustrates a schematic view of an example of the architecture of the optimization and simulation, according to an embodiment. The architecture may include a simulator 210 and a plugin 220. The simulator may calculate the gradients used in an optimization algorithm. The calculated gradients may be transmitted to the plugin 220, which may be or include a gradient-based optimization plugin. The plugin 220 may transmit parameter updates to the simulator 210. In addition, the plugin 220 may communicate with the simulator 210 to cause the simulator 210 to re-run the simulation (e.g., with the parameter updates) and/or to stop the simulation. An optimizer library 230 may be in communication with the plugin 220. The optimizer library 230 may determine the parameter updates for the next run of the simulator 210 based on the values of interest and gradients from the previous simulations using a gradient-based optimization algorithm, as described below.

Figure 3:
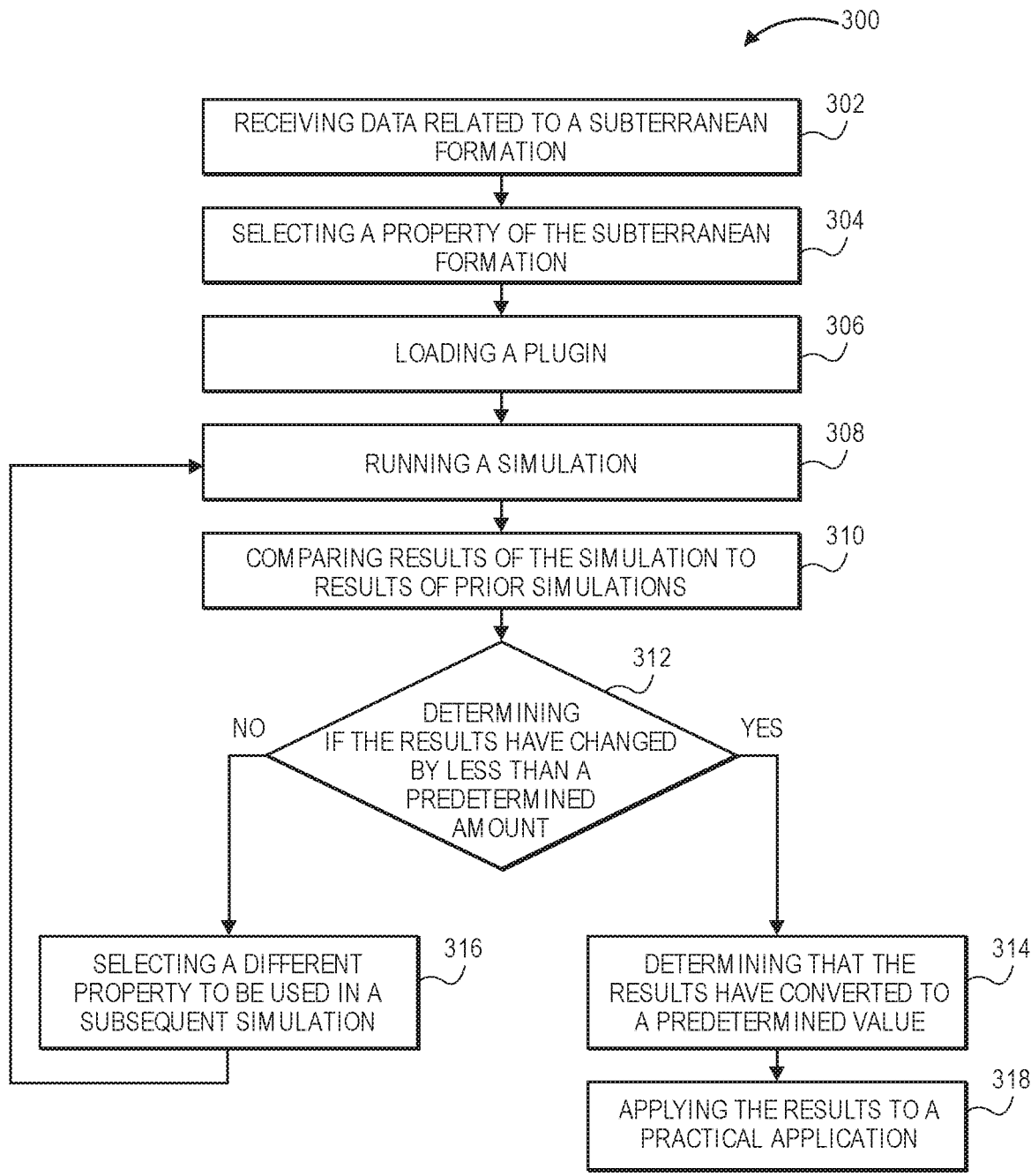
FIG. 3 illustrates a flowchart of a method for optimization, according to an embodiment.

FIG. 3 illustrates a flowchart of a method 300 for generating simulation results of a subterranean formation, according to an embodiment. The method 300 proceeds as shown in the flowchart, which indicates the processes undertaken by both the simulator 210 and the optimizer plugin 220 from a perspective of a workflow.

The method 300 may include receiving data related to a subterranean formation, as at 302. The data may be received at the simulator 210, which may be running on a computing system. The data may be or include seismic data (e.g., output from a program such as PETREL®). More particularly, the data may be or include geological formation data related to, for example, the rock and/or fluid in the subterranean formation. The data may initially be captured by a measurement-while-drilling (MWD) tool in a well, a logging-while-drilling (LWD) tool in a well, or at the surface (e.g., by one or more stakes in the ground). The data may be in the form of a discretized grid of the subterranean formation.

The method 300 may also include selecting one or more properties, as at 304. The property may be selected by a user and received at the simulator 210. In another embodiment, the property may be received at the plugin 220. The selected property may be or include a property of the subterranean formation that is allowed/permitted to vary during a simulation of a model (of the subterranean formation) in an attempt to improve a value of interest. More particularly, some (e.g. most) of the properties in the model may be/remain fixed (i.e., unable to vary) before or during a simulation; however, the user may select one or more properties that may be allowed to vary before or during the simulation to improve the value of interest, as described below. In one example, the user may have a relatively high confidence that the fixed properties are accurate and a lesser confidence that the properties selected to vary are accurate. In another example, the properties selected to vary may be ones that the user has the actual/physical ability to vary, such as which wells connected to the formation are to be opened or shut at particularly times, where the wells should be drilled, or what pressure or fluid flow constraints should be imposed on these wells.

Illustrative properties may be or include properties of the rock in the subterranean formation (e.g., porosity, permeability, fault transmissibility), properties of the fluid in the subterranean formation (e.g., viscosity, initial fluid distribution), properties of connections of a well to a grid (e.g., the quality of the connectivity from well to formation), and properties that impact management and production of the field. Thus, in a particular example, if the selected property is the porosity of the rock in the subterranean formation, then the porosity may be allowed to vary during a simulation of the model, while the other properties (e.g., permeability, fault transmissibility, viscosity, initial fluid distribution, etc.) remain fixed during the simulation of the model. As used herein, a "value of interest" refers to a value related to the results arising from the simulation of fluid flow within the subterranean formation in which the user is interested, such as total production, fit/match to historically-observed well pressure or fluid flow data, net present value (NPV), or the like.

The method 300 may also include loading the plugin 220, as at 306. The plugin 220 may be loaded into the computing system that is running the simulator 210 such that the plugin 220 may interact with the simulator 210. The plugin 220 may augment the simulator 210, or otherwise change how the simulator 210 works (e.g., by requesting the calculation of gradients of the values of interest with respect to the optimization parameters, and/or requesting multiple simulations with different parameter values). The plugin may load information about the value of interest and selected properties that the user has specified directly, or query this information from the simulator 210 if it is provided as part of the simulator input.

The method 300 may also include running a simulation, as at 308. The simulation may be run on/in the simulator 210. The simulation may be run using the data (received at 302) and/or the selected property (selected at 304). In addition, the simulation may be augmented by the plugin 220, as described above. Running the simulation may include simulating a model of the subterranean formation over time. More particularly, this may include simulating a discretized model of pressure variation and fluid flow in the subterranean formation and/or the producing and injecting wells over time.

The results of the simulation may be or include gradients (e.g., changes, differences) of the properties in the model. For example, the results of the simulation may show the rate and/or path that the fluid flows through the rocks and wells over time. In another embodiment, the results of the simulation may be or include gradients in the values of interest, which may be determined based at least partially upon the simulation of the model. For example, the results of the simulation may show how the total production has varied over time.

The method 300 may also include comparing the results of the simulation to results from prior simulations, as at 310. Each simulation may include different data (received at 302) and/or different properties (selected at 304).

In response to the comparison, the method 300 may also include determining if the results (of the current simulation) have changed by less than a predetermined amount (when compared to the results of the prior simulations), as at 312. In at least one embodiment, if the results have changed by less than a predetermined amount (e.g., 0.5%), then it may be determined that the results have converged to a predetermined value (i.e., a value that is likely to be substantially accurate with respect to the corresponding actual subterranean formation), as at 314. If this occurs, no more simulations may be run.

However, if the results have changed by more than the predetermined amount, then the method 300 may proceed to selecting a different property to be used in a subsequent simulation, as at 316. The different property may be selected in an attempt to cause the results of the subsequent simulation to move closer to the predetermined value for the value of interest as indicated, for example, by its value changing by less than the predetermined amount. In one example, the different property may be selected by changing the parameters in a direction that causes the maximum change in the value of interest as indicated by the calculated gradients, and taking a step in that direction that is proportional to the gradient value or the negative of the gradient value depending on whether the predetermined value is a maximum or minimum. Other algorithms may also be used to determine the choice of selected property. The method 300 may then run through one or more iterations of 308, 310, 312, 314, and/or 316 until the results change by less than the predetermined amount (i.e., converge to the predetermined value).

Once the results change by less than the predetermined amount (i.e., converge), the method 300 may include applying the results to a practical application, as at 318. In one embodiment, the practical application may include generating/building an improved model of the subterranean formation based at least partially upon the results. In another embodiment, the practical application may include deciding where to drill a well, steering (e.g., vary a trajectory) of a downhole tool that is drilling the well, varying a weight-on-bit of the downhole tool during drilling, varying one or more properties of a fluid being pumped into and/or flowing out of the well, or the like based at least partially upon results and/or the improved model.

Optimization for reservoir simulation is oftentimes undertaken using a non-gradient-based approach, which drastically limits the number of parameters that can be tuned to achieve an optimum in a realistic timescale. The system and method disclosed herein provide a way of providing gradient-based optimization in immediately accessible workflows, linking in to existing run management environments. An example of an environment with run management capabilities for the INTERSECT™ and ECLIPSE™ reservoir simulator might be PETREL®. The system and method disclosed herein provide the potential to rapidly prototype and interchange different optimizers. The system and method disclosed herein use gradient-based optimization algorithms that permit the simultaneous optimization with thousands (or more) independent parameters.

The system and method disclosed herein provide a simple way to provide decoupling of the optimizer plugin 220 and the simulator 210 in terms of development, while maintaining close coupling at run time for ease of usability, performance, and run management. A prototype has been rapidly developed which shows the utility of this approach.

The system and method disclosed herein may be applied to existing reservoir simulators that are already able to calculate the gradients of values of interest with respect to model input parameters, and which have an extensibility mechanism that would allow an extension plugin to re-run multiple simulations for the purpose of optimization. One example of a reservoir simulator is Schlumberger's INTERSECT™. One existing user of the adjoint gradient calculations from INTERSECT™ is the GeoTesting PETREL® plugin. Its optimization algorithm, which is used to undertake inversion of well test data, may be used within the INTERSECT™ plugin to improve run management and performance. INTERSECT™ may also be able to calculate the gradients of field production measures for the optimization of field management strategies. It may also calculate this for the control of multiple reservoirs. Thus, the system and method disclosed herein may provide a way to combine the gradient calculations with optimization of the field management strategies for general use.

An SDK to allow partners or external clients to develop specific optimization plugins for tailored workflows may be developed to expand the applicability. Such plugins may even be simple, non-commercial developments or prototypes that are defined for specific use cases. In another embodiment, a separate interoperability layer between the simulator and an external optimization package may be used.

The system and method disclosed herein have good usability with the model and optimization defined in one place using one mechanism (e.g., the simulator input files), flexibility including separate development of the optimizer and the simulator, ease of run management, and the ability to rapidly create and deploy new prototype optimizers. The system and method may be used for parallel simulations, and may be modified to improve the optimization algorithm.

The ECLIPSE™ reservoir simulator provides gradient-based optimization as part of the simulator. The optimization in ECLIPSE™ is a part of the simulator and cannot be decoupled. Thus, there is no way at present for a user or client to consider varying optimization algorithms within ECLIPSE™.

The system and method disclosed herein may be incorporated into an existing optimizer as a plugin to provide optimization workflows either to enable history matching or optimization of field management strategies for production. Prototype optimization workflows may also be made available without risking the integrity of the simulator, as the optimization workflow may be a separate application that can be separately installed. The system and method may be made available by providing an SDK for a specific reservoir simulator (e.g., INTERSECT™), which would allow third parties to add their own optimization workflows and algorithms coupled to the use of that simulator. Providing extensibility-based optimization will enable a reservoir simulator's adjoint-derived gradient-based calculations to be opened up to a much wider use base.

Figure 4:
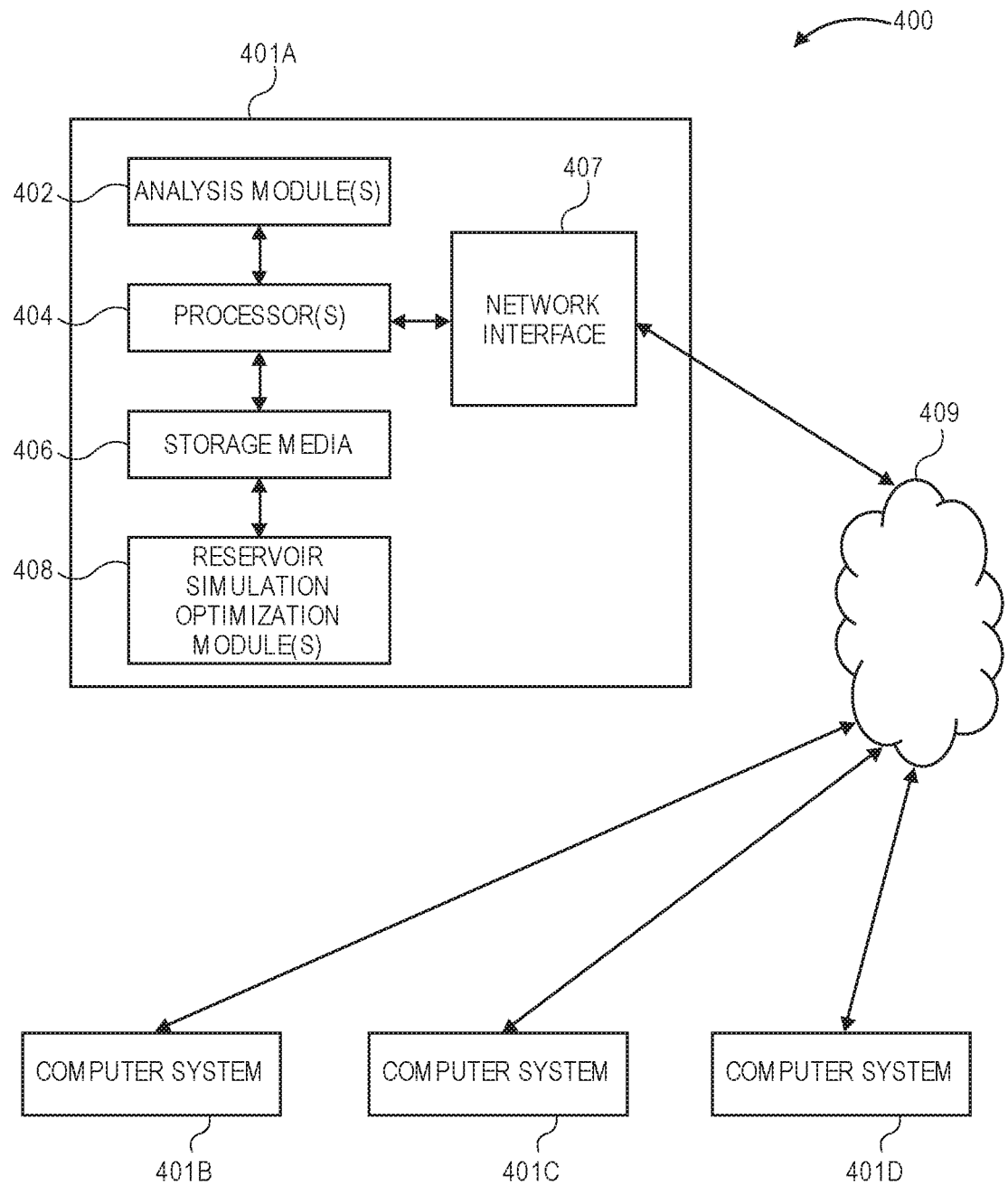
FIG. 4 illustrates an example of a computing system for performing at least a portion of the method, according to an embodiment.

FIG. 4 illustrates an example of such a computing system 400, in accordance with some embodiments. The computing system 400 may include a computer or computer system 401A, which may be an individual computer system 401A or an arrangement of distributed computer systems. The computer system 401A includes one or more analysis module(s) 402 configured to perform various tasks according to some embodiments, such as one or more methods disclosed herein. To perform these various tasks, the analysis module 402 executes independently, or in coordination with, one or more processors 404, which is (or are) connected to one or more storage media 406. The processor(s) 1004 is (or are) also connected to a network interface 407 to allow the computer system 401A to communicate over a data network 409 with one or more additional computer systems and/or computing systems, such as 401B, 401C, and/or 401D (note that computer systems 401B, 401C and/or 401D may or may not share the same architecture as computer system 401A, and may be located in different physical locations, e.g., computer systems 401A and 401B may be located in a processing facility, while in communication with one or more computer systems such as 401C and/or 401D that are located in one or more data centers, and/or located in varying countries on different continents).

A processor can include a microprocessor, microcontroller, processor module or subsystem, programmable integrated circuit, programmable gate array, or another control or computing device.

The storage media 406 can be implemented as one or more computer-readable or machine-readable storage media. Note that while in the example embodiment of FIG. 4 storage media 406 is depicted as within computer system 401A, in some embodiments, storage media 406 may be distributed within and/or across multiple internal and/or external enclosures of computing system 401A and/or additional computing systems. Storage media 406 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLU-RAY® disks, or other types of optical storage, or other types of storage devices. Note that the instructions discussed above can be provided on one computer-readable or machine-readable storage medium, or in another embodiment, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In some embodiments, computing system 400 contains one or more reservoir simulation optimization module(s) 408. In the example of computing system 400, computer system 401A includes the reservoir simulation optimization module 408. In some embodiments, a single reservoir simulation optimization module may be used to perform at least some aspects of one or more embodiments of the method. In other embodiments, a plurality of reservoir simulation optimization modules may be used to perform at least some aspects of the method.

It should be appreciated that computing system 400 is one example of a computing system, and that computing system 400 may have more or fewer components than shown, may combine additional components not depicted in the example embodiment of FIG. 4, and/or computing system 400 may have a different configuration or arrangement of the components depicted in FIG. 4. The various components shown in FIG. 4 may be implemented in hardware, software, or a combination of both hardware and software, including one or more signal processing and/or application specific integrated circuits.

Further, the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are all included within the scope of protection of the invention.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods are illustrated and described may be re-arranged, and/or two or more elements may occur simultaneously. The embodiments were chosen and described in order to best explain the principals of the invention and its practical applications, to thereby enable others skilled in the art to best utilize the invention and various embodiments with various modifications as are suited to the particular use contemplated.

What is claimed is:

1. A method, comprising:
receiving seismic data related to a subterranean formation;
receiving a selection of a property of the subterranean formation that is permitted to vary during a simulation of a model of the subterranean formation;
loading an optimization plugin into a computing system to augment a reservoir simulator that is executable using the computing system;
simulating fluid flow in the model of the subterranean formation based at least partially on the seismic data, and the selected property, using the reservoir simulator, wherein the optimization plugin instructs the reservoir simulator to calculate a gradient of a value of interest with respect to the selected property and instructs the reservoir simulator to optimize the value of interest with respect to the selected property by varying the selected property according to a selected gradient-based optimization algorithm executed by the optimization plugin; and
generating an updated model based at least partially upon an optimized result of simulating the fluid flow in the model.

2. The method of claim 1, wherein other properties of the subterranean formation that are not selected remain fixed while simulating the fluid flow in the model.

3. The method of claim 2, wherein receiving the selection of the property comprises receiving the selection of the property based at least partially upon a lower confidence that the selected property is accurate in comparison to a higher confidence that the other properties that are not selected are accurate.

4. The method of claim 2, wherein receiving the selection of the property comprises receiving the selection of the property based at least partially upon the selected property being capable of being physically varied at a wellsite by a user.

5. The method of claim 1, wherein the selected property comprises a rock property of the subterranean formation or a fluid property of the subterranean formation.

6. The method of claim 1, wherein the optimization plugin causes the reservoir simulator to run a plurality of simulations of the fluid flow in the model, wherein each simulation comprises a different selected property.

7. The method of claim 1, further comprising:
comparing an intermediate result of the simulation of the model to results from prior simulations of the model, wherein the prior simulations comprise different seismic data, different selected properties, or both.

8. The method of claim 1, further comprising determining that the optimized result of the simulation is optimal upon convergence to a predetermined value of the value of interest within a predetermined amount.

9. The method of claim 1, further comprising, via the optimization plugin, selecting a different property to be used in a subsequent simulation of the model when a result of the simulation has changed by more than a predetermined amount.

10. The method of claim 9, wherein the different property is selected to cause a maximum change in the value of interest as indicated by a gradient of the value of interest with respect to the different property.

11. The method of claim 1, further comprising applying the optimized result to a practical application.

12. The method of claim 1, further comprising selecting where to drill a well in the subterranean formation, steering a downhole tool that drills the well, or both, based at least partially upon the updated model.

13. The method of claim 1, wherein the gradient-based optimization algorithm is selected from a library of gradient-based optimization algorithms.

14. The method of claim 13, comprising, after optimizing the value of interest with respect to the selected property, automatically selecting a different gradient-based optimization algorithm from the library.

* * * * *